United States Patent [19]

Ettenberg

[11] 4,092,659

[45] May 30, 1978

[54] MULTI-LAYER REFLECTOR FOR ELECTROLUMINESCENT DEVICE

[75] Inventor: Michael Ettenberg, Freehold, N.J.

[73] Assignee: RCA Corporation, New York, N.Y.

[21] Appl. No.: 791,944

[22] Filed: Apr. 28, 1977

[51] Int. Cl.² .................. H01S 33/00; H01S 3/00
[52] U.S. Cl. ...................... 357/18; 357/17; 331/94.5 H
[58] Field of Search .............. 331/94.5 H; 357/17, 357/18

[56] References Cited

U.S. PATENT DOCUMENTS

| | | | |
|---|---|---|---|
| 3,701,047 | 10/1972 | Caplan | 331/94.5 |
| 3,849,738 | 11/1974 | Hakki | 331/94.5 H |
| 4,001,719 | 1/1977 | Krupka | 331/94.5 H |

Primary Examiner—Martin H. Edlow
Attorney, Agent, or Firm—H. Christoffersen; B. E. Morris; D. S. Cohen

[57] ABSTRACT

A reflector of optical radiation is on at least one radiation emitting facet of an electroluminescent device. The reflector includes a plurality of contiguous layers of alternating composition. The layers are of silicon and a material selected from the group consisting of aluminum oxide, magnesium fluoride and silicon dioxide. Each of the layers is approximately $\lambda/4n$ in thickness where "$\lambda$" is the free space wavelength of radiation emitted from the electroluminescent device, and "$n$" is the index of refraction of the layer. Two of the alternating contiguous layers provide a reflector which is partially reflecting, while six of the layers provide a reflector substantially reflecting to optical radiation.

7 Claims, 3 Drawing Figures

MULTI-LAYER REFLECTOR FOR ELECTROLUMINESCENT DEVICE

BACKGROUND OF THE INVENTION

The U.S. Government has rights to this invention pursuant to Contract No. 12713(6265760126)76R.

The present invention relates to a multi-layer reflector on at least one radiation emitting facet surface of a semiconductor electroluminescent device, such as a laser or a light emitting diode (LED).

Semiconductor lasers and LED's, in general, are bodies of single crystalline semiconductor material which when biased emit optical radiation, either visible or infrared, due to the recombination of pairs of oppositely charged carriers. These devices generally include regions of opposite conductivity types forming a PN junction therebetween.

A semiconductor laser emits coherent optical radiation because, unlike the LED, it includes an optical cavity and is biased so as to create the condition of carrier population inversion. The LED emits incoherent optical radiation. The optical cavity, typically of the Fabry-Perot type, is formed by cleaving opposite facet surfaces of the laser and sawing the adjacent sides of the laser structure. Waveguiding is accomplished in the cavity by suitable index of refraction profiling perpendicular to the PN junction plane. Population inversion is necessary in achieving lasing action and is that condition where enough carriers are excited to an upper energy state such that a photon is more likely to stimulate emission of another photon, rather than being absorbed and exciting a new carrier to the higher energy state.

More specifically, when the junction of the laser is forward biased, charge carriers of one type are injected from one of the conductivity regions into the other conductivity region where the predominate charge carriers are of an opposite type. The injected carriers are at an upper energy state and when they cross the PN junction they may recombine with oppositely charged carriers, and in the recombination process give off energy in the form of optical radiation. Emitted photons which interact with carriers at an upper energy state stimulate these carriers into recombination, an act which results in the emission of more photons. This process is known as stimulated emission. For lasing action to occur, the laser must be biased at or above its threshold current density, i.e., at this critical biasing point population inversion is present. As a consequence of population inversion photons are more likely to interact with carriers at an upper energy state and stimulate the emission of more photons. The occurence of population inversion therefore brings about a situation where optical gain exceeds optical loss.

The lasing action takes place in the optical cavity or waveguide. While recombination of light creates photons which emit in all directions, only those which are confined and guided by the waveguide have low enough optical losses to reach threshold and those modes are the ones that lase.

The guided wave propagates in a direction normal to the facet surfaces of the optical cavity. Typically, both of the facet surfaces are partially reflecting to the optical radiation. Consequently, when the guided wave of optical radiation strikes a facet surface it may be reflected back into the cavity where it continues to stimulate carrier recombination, thus, the optical radiation is amplified. Eventually, some of the amplified optical radiation is emitted as coherent optical radiation at the partially reflecting facet surfaces.

A problem which has plagued those in the semiconductor laser art for some time is a lowering of the laser threshold. As explained, the lasing threshold is that current density that must be applied to the semiconductor laser for the lasing action to be present in the cavity. If the reflectivity is high at one of the facet surfaces, the threshold current density is lowered, since much more optical radiation is reflected back into the cavity for amplification. Thus, it is advantageous to have one facet surface partially reflective and the opposite facet surface substantially reflective.

Also, reflectors are frequently used on LED surfaces to direct the generated radiation out of the LED at a particular surface or surfaces. The higher the reflectivity of the reflector the better will be the LED's output in the desired direction. Therefore, it would be most desirable in the field of semiconductor lasers and LED's to have a reflector which has a very high reflectivity.

SUMMARY OF THE INVENTION

A multi-layer reflector is utilized on at least one facet surface of a semiconductor electroluminescent device capable of optical radiation emission in the wavelength range of 0.6 to 1.3 micrometers. The reflector includes a plurality of contiguous layers of alternating composition. The contiguous layers are of silicon and a material selected from the group consisting of aluminum oxide, ($Al_2O_3$), magnesium fluoride, ($MgF_2$) and silicon dioxide, ($SiO_2$). The contiguous layer in contact with the facet surface is of the selected group of materials. Each of the contiguous layers are approximately $\lambda/4n$ in thickness, where "$\lambda$" is the free space wavelength of radiation emitted from the electroluminescent device, and "$n$" is the index of refraction of the layer.

DETAILED DESCRIPTION OF THE INVENTION

Figure 1:
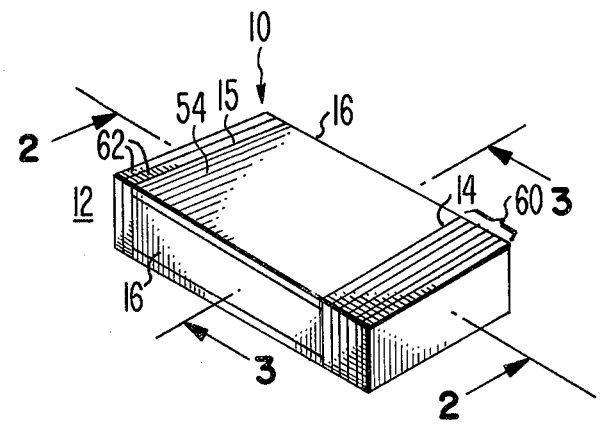
FIG. 1 is a perspective view of a semiconductor injection laser with the multi-layer reflector of the present invention.
Figure 2:
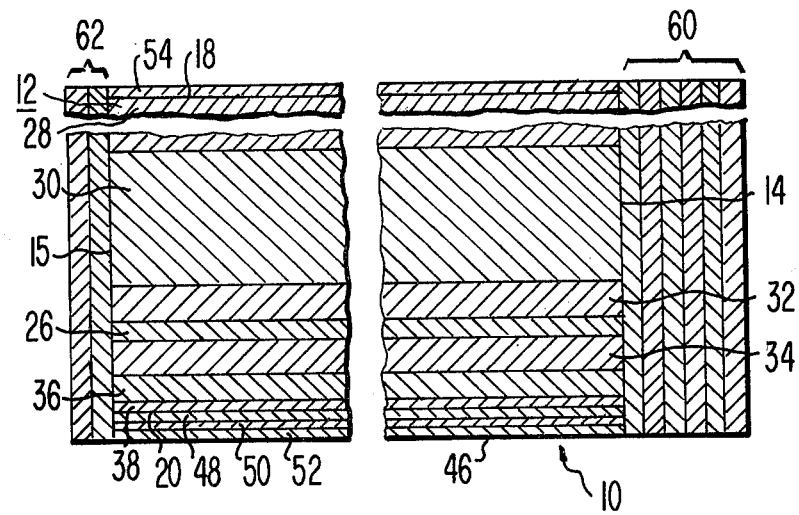
FIG. 2 is a longitudinal sectional view of the laser and reflector taken along line 2—2 of FIG. 1.
Figure 3:
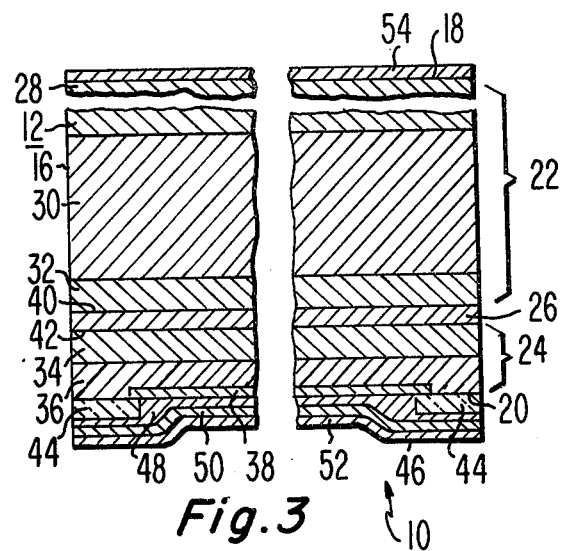
FIG. 3 is a transverse sectional view of the laser taken along line 3—3 of FIG. 1.

Referring to FIGS. 1, 2 and 3, a semiconductor electroluminescent device having the multi-layer reflector of the present invention is generally designated as 10. For the purpose of describing the multi-layer reflector, the electroluminescent semiconductor 10 is a continuous wave (C.W.) injection laser capable of 100% duty cycle operation. However, other laser structures and LED's can utilize the reflector of the present invention.

The injection laser 10 comprises a parallelepiped body 12 of a single crystalline semiconductor material capable of emitting radiation in the wavelength range of 0.6 to 1.3 micrometers. The body 12 has opposed first and second facet surfaces 14 and 15, which are capable of emitting optical radiation, opposed side surfaces 16 extending to the facet surfaces 14 and 15 and opposite first and second contact surfaces 18 and 20 which extend to the facet surfaces 14 and 15 and side surfaces 16.

The semiconductor body 12 has therein a first region 22 of N type conductivity extending along the first contact surface 18, a second region 24 of P type conductivity extending along the second contact suface 20 and a third region 26 contiguous to and between the first and second regions 22 and 24. The third region 26 may be either P type or N type. The first region 22, the second region 24 and the third region 26 extend between the first and second facet surfaces 14 and 15 of the semiconductor body 12.

The first region 22 is made up of a substrate 28 of highly doped (high conductivity) N type gallium arsenide, a first epitaxial layer 30 of N type gallium arsenide on the substrate 28 and a second epitaxial layer 32 of N type aluminum-gallium arsenide on the first epitaxial layer 30. The third region 26 is a thin third epitaxial layer of aluminum-gallium arsenide on the second epitaxial layer 32. The second region 24 is made up of a fourth epitaxial layer 34 of P type aluminum-gallium arsenide on the third epitaxial layer forming the third region 26, a fifth epitaxial layer 36 of P type gallium arsenide on the fourth epitaxial layer 34, and a thin highly doped (high conductivity) P type diffused layer 38 in the fifth epitaxial layer 36 and extending along the second contact surface 20 of the semiconductor body 12.

The third region 26 forms the recombination region of the C.W. injection laser 10 and is generally thin, i.e., less than 0.4 micrometer. The second epitaxial layer 32 of the first region 22 is of a thickness of between 1 and 3.5 micrometers and has an aluminum content greater than the aluminum content of the third region 26. The fourth epitaxial layer 34 of the second region 24 is of a thickness of between 0.3 and 2 micrometer and also has an aluminum content greater than the aluminum content of the third region 26. The difference in the aluminum content between the materials of the second and fourth epitaxial layers 32 and 34 and the third region 26 forms heterojunctions 40 and 42 between the third region 26 and the second and fourth epitaxial layers 32 and 34, respectively.

On the second contact surface 20 of the semiconductor body 12 are a pair of spaced apart stripes 44 of an electrical insulating material, such as silicon dioxide. The insulating stripes 44 extend along opposite sides of the second contact surface 20 from the first facet surface 14 to the second facet surface 15. Each stripe should extend from its adjacent side surface 16 a distance of at least 5 micrometers. A metal contact 46 is on the second contact surface 20 of the semiconductor body 12 between the insulating stripes 44 and on the insulating stripes 44. The metal contact 46 typically includes three superimposed layers 48, 50 and 52 of electrically conductive metals which can be applied by standard methods. The metal of the first layer 48, which is on the surface 20 of the semiconductor body 12, must also be capable of good adherence to and provide a good ohmic content with the semiconductor body 12. Titanium or chromium are suitable metals for the first layer 48. The metal of the third layer 52 which is the outermost layer, should also be relatively non-oxidizable and easily bound to the second layer 50. Gold is a suitable metal for the third layer 52. The second layer 50, the intermediate layer, should also be capable of providing good adhesion between the third layer 52 and the first layer 48 and be capable of preventing undesirable alloying of the metals of the first and third layers. Platinum or nickel are suitable metals for the second layer 50.

A metal contact 54 is on the first contact surface 18 of the semiconductor body 12. The metal contact 54 can be of any electrically conductive metal which adheres well to and makes a good ohmic contact with the semiconductor body 12. The contact 54 can be a multi-layer contact, such as the contact 46 on the second contact surface 20, or it can be of a single metal such as tin.

On the first facet surface 14 is a first multi-layer reflector 60, which is substantially reflective to the optical radiation emitted from the C.W. injection laser 10, i.e., in the range of 0.6 to 1.3 micrometers in wavelength. On the second facet surface 15 is a second multi-layer reflector 62 which is partially transparent to the optical radiation emitted from the C.W. injection laser 10. The multi-layer reflectors 60 and 62 each include a plurality of contiguous layers of alternating composition. The layers are of silicon (Si) and a material selected from the group consisting of aluminum oxide, ($Al_2O_3$), magnesium fluoride, ($MgF_2$) and silicon dioxide, ($SiO_2$). In each of the reflectors 60 and 62, the layer contiguous to the facet surfaces 14 and 15 is of the selected group of materials. In both of the reflectors 60 and 62 contiguous layers are each approximately $\lambda/4n$ in thickness, where "$\lambda$" is the free space wavelength of radiation emitted from the laser 10, and "$n$" is the index of refraction of the particular contiguous layer.

For the purpose of describing the reflectors 60 and 62 of the present invention, it is assumed that the contiguous layer or layers of the selected group of materials is of aluminum oxide, ($Al_2O_3$).

The reflectivity of the multi-layer reflector of the present invention for one to six contiguous layers has been calculated and is shown in Table 1. The reflectivities shown in Table 1 are for radiation emission of approximately 0.8 micrometers wavelength and with the reflector on a facet of a gallium arsenide (GaAs) substrate. The reflectivities of Table 1 are given in percentages and were calculated using equation (1) (as shown below) for even numbers of contiguous layers, and equation (2) (as shown below) for odd numbers of contiguous layers.

$$R_{EVEN} = \frac{N_{GaAs}\left(\frac{N_{Si}}{N}\right)^{2n} - 1}{N_{GaAs}\left(\frac{N_{Si}}{N}\right)^{2n} + 1} \times 100 \quad \text{(Eq. 1)}$$

$$R_{ODD} + 1 = \frac{\left(N_{Si}\right)^2\left(\frac{N_{Si}}{N}\right)^{2n} - N_{GaAs}}{\left(N_{Si}\right)^2\left(\frac{N_{Si}}{N}\right)^{2n} + N_{GaAs}} \times 100 \quad \text{(Eq. 2)}$$

where "$N_{Si}$" is index of refraction of the silicon layer, "$N$" is the index of refraction of the particular material of the selected group that is being used, "$n$" is the number of layers, and $N_{GaAs}$ is the index of refraction of the gallium arsenide. Since the index of refraction of gallium arsenide, (GaAs) and aluminum gallium arsenide, (AlGaAs) are very close in value, the reflectivities of Table 1 are a close approximation to the expected reflectivity of the reflectors 60 and 62 on the laser 10, which comprises gallium arsenide and aluminum gallium arsenide regions.

TABLE I

| Layer | | Reflectivity (%) |
|---|---|---|
| 1st | Al₂O₃ | less than 1.0 |
| 2nd | Si | 77.0 |
| 3rd | Al₂O₃ | 76.0 |
| 4th | Si | 94.0 |
| 5th | Al₂O₃ | 93.0 |
| 6th | Si | 99.0 |

As shown from Table 1, the reflectivity of a single first layer of aluminum oxide is negligible, while the addition of a second layer of silicon raises the reflectivity of the reflector to 77%, i.e., a reflector partially reflecting. The addition of four more contiguous layers, alternating in composition between aluminum oxide and silicon, raises the reflector reflectivity to about 99%, i.e., a reflector substantially reflecting.

Since it is desired that the multi-layer reflector 60 be substantially reflecting, it is typically of six contiguous layers, although five or four contiguous layers would also be acceptable. As for the second multi-layer reflector 62, since it is desirable that it be partially reflecting, it is typically of two contiguous layers although three contiguous layers would also be acceptable.

In the operation of the injection laser 10, a forward bias voltage is applied to the body 12 by connecting the contacts 46 and 54 to a source of current. As a result of the forward bias voltage, charged carriers are injected into the third region 26 from the first and second regions 22 and 24. The oppositely charged carriers injected into the third region recombine in the third region 26 to generate optical radiation. The optical radiation generated in the third region 26, i.e., of a wavelength in the range of 0.6 to 1.3 micrometers, will typically be directed towards one of the facet surfaces 14 or 15 as a result of the waveguiding of the third region 26. While traveling along the third region 26 towards a facet surface, the radiation will grow in intensity as a result of stimulated emission until it reaches a facet surface, either 14 or 15. At the facet surface, the radiation may be reflected back into the third region 26 so that the amplification of the radiation can continue. The radiation amplitude will be built up by the repeated passage through the third region 26. With the second multi-layer reflector 62 being partially transparent to the generated radiation, a portion of the radiation can escape through it, constituting the optical radiation output of laser 10. As evidenced from Table 1, the overall reflectivity of the multi-layer reflector increases with the addition of a silicon layer and an aluminum oxide layer. The increase in reflectivity is because the optical radiation reflection caused by additional layers is cumulative to the reflection of the other contiguous layers.

Furthermore, referring to equations 1 and 2, it is evident that the greater the difference in index of refraction between two contiguous layers, the greater will be the resulting reflectivity. Thus, silicon with a relatively high index of refraction of approximately 3.3 and aluminum dioxide with a relatively low index of refraction of approximately 1.7 appear to be ideally suited for reflector application. However, the optical radiation absorption of silicon is large and would not make it appear to be suitable for reflector application. Referring to the book "Physics of Thin Films," G. Hass et al., Vol. 2, 1964, Academic Press, p. 294, the authors state that the transmission of optical radiation through silicon is cut off at a wavelength of approximately 1.1 microns. While such data tends to discourage the use of silicon, it has been discovered that silicon in the reflector of the present invention absorbs to a tolerable degree optical radiation in the range of 0.6 to 1.3 micrometers wavelength. The increase in reflectivity as a result of the high index of refraction of silicon outweighs the optical absorption characteristics of silicon. It is believed that because the layers of silicon are relatively thin, i.e., a thickness of about $\lambda/4n$, radiation absorption is not a significant problem to optical radiation in the 0.6 to 1.3 micrometer range.

The contiguous layers are preferably approximately $\lambda/4n$ in thickness so that the reflected radiation beams at the contiguous layer interfaces are all in phase.

As a result of the high reflectance of the first multi-layer reflector 60, the threshold current of the C.W. injection laser 10 is reduced while the optical output emission from the partially reflective facet surface 15 is increased. Furthermore, it has been discovered that the multi-layer reflectors 60 and 62 are resistant to chemical attack and thus protect the first and second facet surfaces 14 and 15 of laser 10. For example, when the C.W. injection laser chip is bonded to a heat sink, the chip is subjected to chemical attack.

The fabrication of the multi-layer reflector of the present invention can be carried out using conventional electron beam gun evaporation in a vacuum of between $5 \times 10^{-4}$ to $5 \times 10^{-7}$ torr, with the facet surface at a temperature in the range of about 100° to 250° C. However, a facet surface temperature of approximately 175° C. is preferable.

While the multi-layer reflector of the present invention has been described as being on both facet surfaces, it is anticipated by the present invention that it may be only on one facet surface, typically where the reflection is to be substantial. On that facet surface not having the multi-layer reflector of the present invention, is a conventional coating that does not substantially change or lower the reflectivity of the facet surface, or no coating at all.

The multi-layer reflector of the present invention provides electroluminescent devices with excellent reflecting properties and resistance to chemical attack during fabrication processing.

I claim:

1. A semiconductor electroluminescent device comprising:

a body of semiconductor material capable of radiation emission in the wavelength range of 0.6 to 1.3 micrometers, said body having opposed facet surfaces from which the radiation is capable of being emitted; and a reflector on at least one facet surface, said reflector having a plurality of contiguous layers of alternating composition, said layers being of silicon (Si) and a material selected from the group consisting of aluminum oxide ($Al_2O_3$), magnesium fluoride ($MgF_2$) and silicon dioxide ($SiO_2$), said layer being contiguous to said facet surface is of said selected group of material, said contiguous layers are each approximately $\lambda/4n$ in thickness, where "$\lambda$" is the free space wavelength of radiation emitted from the electroluminescent device, and "$n$" is the index of refraction of the layer.

2. The semiconductor electroluminescent device in accordance with claim 1 wherein said plurality of contiguous layers comprises one layer of a material from the selected group and one layer of silicon.

3. The semiconductor electroluminescent device in accordance with claim 1 wherein said plurality of contiguous layers comprises three layers of a material from the selected group and three layers of silicon.

4. The semiconductor electroluminescent device in accordance with claim 2 wherein said reflector is on both facet surfaces.

5. A semiconductor electroluminescent device comprising:

a body of semiconductor material capable of radiation emission in the wavelength range of 0.6 to 1.3 micrometers, said body having opposed facet surfaces from which the radiation is capable of being emitted; and a first reflector having a first layer of a material selected from the group consisting of aluminum oxide ($Al_2O_3$), magnesium fluoride ($MgF_2$) and silicon dioxide ($SiO_2$) contiguous to a facet surface, and a second layer of silicon (Si) contiguous to said first layer, said first and second layers are each approximately $\lambda/4n$ in thickness, where "$\lambda$" is the free space wavelength of radiation emitted from said device, and "$n$" is the index of refraction of the layer.

6. The electroluminescent device in accordance with claim 5 further comprising:

a second reflector on said opposite facet surface having six contiguous layers of alternating composition, said contiguous layers are of silicon (Si) and a material selected from the group consisting of aluminum oxide ($Al_2O_3$), magnesium fluoride ($MgF_2$) and silicon dioxide ($SiO_2$), said layer contiguous to said opposite facet surface is of said selected group of materials, said layers are each approximately $\lambda/4n$ in thickness, where "$\lambda$" is the free space wavelength of radiation emitted from the device, and "$n$" is the index of refraction of said layer.

7. A semiconductor electroluminescent device comprising:

a body of semiconductor material having opposed facet surfaces, opposed side surfaces extending to said facet surfaces and opposed first and second contact surfaces extending to said facet and side surfaces, a first region of N-type conductivity extending along said first contact surface, a second region of P-type conductivity extending along said second contact surface, and a third region contiguous to and between said first and second region, said third region capable of emitting radiation in the wavelength range of 0.6 to 1.3 micrometers; and a reflector on at least one facet surface, said reflector having a plurality of contiguous layers of alternating composition, said layers being of silicon (Si) and a material selected from the group consisting of aluminum oxide ($Al_2O_3$), magnesium fluoride ($MgF_2$) and silicon dioxide ($SiO_2$) said layer being contiguous to said facet surface is of said selected group of materials, said contiguous layers are each approximately $\lambda/4n$ in thickness, where "$\lambda$" is the free space wavelength of radiation emitted from the electroluminescent device, and "$n$" is the index of refraction of the layer.

* * * * *